United States Patent
Lee

[11] Patent Number: 5,834,372
[45] Date of Patent: Nov. 10, 1998

[54] PRETREATMENT OF SEMICONDUCTOR SUBSTRATE

[75] Inventor: Young Chong Lee, Daejon, Rep. of Korea

[73] Assignee: LG Semicon., Ltd., Cheongju, Rep. of Korea

[21] Appl. No.: 571,052

[22] Filed: Dec. 12, 1995

[30] Foreign Application Priority Data

Jul. 24, 1995 [KR] Rep. of Korea .................. 21855/1995

[51] Int. Cl.[6] .................................................. H01L 21/44
[52] U.S. Cl. .......................... 438/677; 438/653; 438/680; 427/255.1; 427/535
[58] Field of Search ..................................... 437/197, 198, 437/199, 200, 201; 438/680, 653, 677; 427/255.1, 535

[56] References Cited

U.S. PATENT DOCUMENTS 5,047,367  9/1991  Wei et al. ............................... 437/200
5,429,991  7/1995  Iwasaki et al. .......................... 437/192
5,665,640  9/1997  Foster et al. ............................ 438/680

*Primary Examiner*—Charles L. Bowers, Jr.
*Assistant Examiner*—Renee R. Berry
*Attorney, Agent, or Firm*—Fleshner & Kim

[57] ABSTRACT

A method for pretreating a semiconductor surface, comprising the steps of: placing a titanium nitride substrate in a reaction chamber and subjecting the reaction chamber to vacuum; purging the reaction chamber with an inert gas selected from the group consisting of $N_2$, Ar and He and evacuating the reaction chamber into 1 mTorr or lower; treating the surface of the titanium nitride substrate with a reaction gas comprising WF; charging a reducing gas and a source gas for deposition material to form a thin film on the titanium nitride substrate, by which the nucleation rate of deposition material and the number of nucleation sites on the substrate can be increased and a thin film with a uniform thickness and high density can be formed on the substrate.

21 Claims, 6 Drawing Sheets

$WF_6$ = 1mol
$TiO_2$ = 1mol
P = 1Torr

PRETREATMENT OF SEMICONDUCTOR SUBSTRATE

BACKGROUND OF THE INVENTION

1. Field of the Invention

The present invention relates, in general, to a method for treating a semiconductor substrate prior to chemically depositing any material thereon and, more particularly, to use of a reaction gas comprising WF and subsequently a reducing gas along with a source gas for deposition material, thereby leading to uniform and fast nucleation.

2. Description of the Prior Art

A titanium nitride (TiN) thin film is usually used for a diffusion barrier layer in a metallization process when fabricating a semiconductor device. The titanium nitride film can be formed largely by two processes: physical vapor deposition (hereinafter referred to as "PVD") process and chemical vapor deposition (hereinafter referred to as "CVD").

In PVD process, a titanium nitride is formed in such a way that argon atoms accelerated in a reactor sputter into a titanium target, so as to react with nitrogen ($N_2$). A representative example of PVD process includes reactive sputtering process.

As for CVD process, a titanium nitride is formed through reaction of titanium chloride ($TiCl_4$) with ammonia ($NH_3$). Typical examples of CVD process include low pressure CVD (LPCVD) and plasma enhanced CVD (PECVD). Besides, metal organic CVD (MOCVD), which uses metal organic precursor, has recently attracted attention.

Generally, the titanium nitride deposited by CVD or PVD slowly reacts in most chemical reactions owing to very strong bond between titanium (Ti) and nitrogen atom (N). After being deposited, the titanium nitride, if exposed to air, goes into natural oxidation, to form a thin oxynitride layer with a thickness of about 10 to 15 Angstrom, on the surface.

Thus, when a metal thin film is deposited on a substrate of titanium nitride by CVD, nucleation rate is very slow such that steady-state deposition cannot be accomplished at early reaction time. For example, when tungsten is deposited at 450° C. by a chemistry of $WF_6$—$H_2$, a time delay of about 7 to 10 min is observed. Upon deposition of copper by MOCVD, nucleation on the surface of the titanium nitride does not occur at a high rate and it is observed that islands of copper crystal granules are sparsely dotted.

FIGS. 1 and 2 show the time delays which are observed in appearance when a tungsten thin film and a copper thin film are deposited on a titanium nitride substrate at a predetermined temperature, respectively. In FIG. 1, there are plotted the thicknesses of the tungsten thin film with regard to deposition times. Likewise, the thicknesses of copper thin film are plotted in FIG. 2.

Not only does slow nucleation take much time to obtain normal deposition of the thin films as shown in the figures, deleteriously aggravating thickness uniformity, but also it shows a disadvantage of decreasing the throughput. In addition, since the thin film grown is low in density, resistivity increases when it is applied for interconnection, which results in a significant decrease of device reliability.

It is reported a more improved method which asserts that a tungsten thin film with a higher density can be formed on a titanium nitride substrate by the chemistry of $WF_6$, without time delay. To the end, the depositing method suggests that, at initial stage, only $WF_6$ is charged for a certain time to let $WF_x$ adhere to the surface of the titanium nitride substrate and then, $WF_6$ and reducing gas such as $H_2$ or $SiH_4$, are added simultaneously. In more detail, a substrate covered with titanium nitride is placed in a reaction chamber which is, then, evacuated to 1 mTorr or less. Subsequently, $WF_6$ is charged into the reaction chamber at a predetermined temperature, e.g. about 300° to 450° C., for a certain time, to form nucleus. Thereafter, mixture gas of $WF_6$ and $H_2$ or $SiH_2$ is charged to form a tungsten thin film. This is, after nucleation is done by charging only $WF_6$ or activation is done by charging only $WF_6$, the thin film grows under a reducing gas such as $H_2$ or $SiH_4$.

Where a metal thin film is formed by the above-mentioned method, the continuity of thin film can be secured while reducing the time delay to some extent. However, there are several suggestions what happens when the surface of titanium nitride is exposed to $SF_6$.

Based on the fact that titanium nitride is very stable and shows low reactivity with $WF_6$, it was suggested that nucleation occurs via a mechanism that looks as if tungsten had been deposited from $WF_6$ over the oxide film, $SiO_2$. Another suggestion was that tungsten seeds and $TiF_3$ of solid phase are formed upon $WF_6$—TiN reaction, which was based on thermodynamic calculation but not verified by experiment.

Meanwhile, a experiment result was submitted that, since volatile $TiF_4$ rather than $TiF_3$ of solid phase is formed as a by-product by the chemistry of $WF_6$—TiN and easily evaporated from the surface of titanium nitride, no by-products are detected at the interface between tungsten and titanium nitride after deposition of tungsten.

In this experiment result, seed formation reaction was proposed as follows:

$$4WF_6(g)+6TiN \rightarrow 4W+6TiF_4(g)+3N_2 \qquad [I]$$
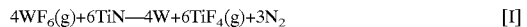

This reaction formula, however, cannot illustrate the time delay and tungsten islands locally formed on the surface of titanium nitride, neither. In addition, what influence the natural oxide film formed on the titanium nitride has on nucleation is not considered in the above-mentioned techniques.

In order to know the influence of the oxide layer of the titanium nitride on nucleation thermodynamic simulation was executed under $WF_6$—$TiO_2$ system on the assumption that the oxide layer is $TiO_2$ (s). FIG. 3 is the result of this thermodynamic simulation. As shown in this figure, when the temperature is 450° C. or less, the oxygen of $TiO_2$ (s) is transformed into $WO_3$ (s) through the reaction formula [II] as suggested below:

$$2WF_6+3TiO_2(s) \rightarrow 2WO_3(s)+3TiF_4 \qquad [II]$$

and Ti is eliminated in the form of $TiF_4$ (g).

On the other hand, when the temperature is over 450° C., tungsten-oxyfluoride ($WOF_4$) is increasingly generated together with $TiF_4$ as the consumption amount of the charged $WF_6$ increases whereas $WO_3$ (s) remains at the interface between tungsten and titanium nitride, deleteriously affecting the interface property. Thus, it is not desirable that only $WF_6$ is charged for nucleation. What is worse, if $WF_6$ is charged for long time, $WF_x$ penetrates along the grain boundaries of titanium nitride, having a serious influence on the lower layer of titanium nitride.

SUMMARY OF THE INVENTION

Therefore, it is an object of the present invention to overcome the above problems encountered in prior arts and to provide a method for pretreating the surface of a titanium nitride substrate, by which the nucleation rate of deposition material and the number of nucleation sites on the substrate can be increased.

It is another object of the present invention to provide a method for pretreating the surface of a titanium nitride substrate, by which a thin film with a uniform thickness and high density is formed on the substrate.

Based on the intensive and thorough research by the present inventor, the above objects could be accomplished by a provision of a method for pretreating a semiconductor substrate, comprising the steps of: placing a titanium nitride substrate in a reaction chamber and subjecting the reaction chamber to vacuum; purging the reaction chamber with an inert gas selected from the group consisting of $N_2$, Ar and He and evacuating the reaction chamber into 1 mTorr or lower; treating the surface of the titanium nitride substrate with a reaction gas comprising WF; charging a reducing gas and a source gas for deposition material to form a thin film on the titanium nitride substrate.

BRIEF DESCRIPTION OF THE DRAWINGS

The above objects and other advantages of the present invention will become more apparent by describing in detail the preferred embodiments of the present invention with reference to the attached drawings in which.

DETAILED DESCRIPTION OF THE INVENTION

The present invention is concerned with a CVD process for forming on a titanium nitride substrate a metal thin film such as aluminum or tungsten, in which the substrate is surface-treated by use of a reaction gas including WF, to increase the nucleation rate and site number of the metal material.

In more detail, first, a titanium nitride-deposited substrate is placed in a reaction chamber, which is then evacuated and purged up to 3 times with an inert gas such as nitrogen ($N_2$), argon (Ar) or helium (He) gas.

Subsequently, the pressure of the reaction chamber is reduced into 1 mTorr or less and $WF_6$—$SiH_4$ is charged for a predetermined time, to completely remove the oxide surface layer of the titanium nitride.

After ceasing to charge $WF_6$—$SiH_4$, a source gas for deposition and a reducing gas are charged to deposit a thin film on the titanium nitride substrate.

During elimination of the oxide surface layer, the substrate is maintained at a temperature of about 300° to 600° C. under $10^{-3}$-several tens Torr in the reaction chamber with about 0.1–1.0 partial pressure ratio of $SiH_4$ to $WF_6$.

Herein, besides $WF_6$—$SiH_4$, $WF_6$—$SiH_4$—$H_2$ and $WF_6$—$H_2$ can be used as the gas mixture for the pretreatment of the oxide surface layer. Important in the case is the partial pressure ratio of $SiH_4$ to $WF_6$. As mentioned previously, $H_2$ is charged in such a way that the total pressure within the reaction chamber may be in a range of about $10^{-3}$ to several tens torr while the partial pressure ratio of $SiH_4$ to $WF_6$ is maintained at about 0.1 to 1.0.

Gas mixture based on $WF_4Cl_2$, for example, $WF_4Cl_2$—$SiH_4$, $WF_4Cl_2$—$H_2$ or $WF_4Cl_2$—$SiH_4$—$H_2$, can be used for pretreatment, in which case the $SiH_4$ gas may be substituted by $Si_2H_6$ or $Si_3H_8$.

In order to increase the effect of pretreatment as highly as possible, the deposition of thin film must be done immediately after the pretreatment by an in-situ process in which the vacuum is not broken. Examples of the thin film to be deposited comprise a copper film or aluminum film, which can be deposited by MOCVD using metal organic precursor, a tungsten film from $WF_6$ source, and various metal silicides, e.g. $WSi_x$ and $TiSi_x$.

A more detailed description will be given of surface pretreatment technology which comprises removing the oxide layer of titanium nitride surface by use of $WF_6$—$SiH_4$ to facilitate the nucleation of the material to be deposited, in conjunction with the accompanying drawings.

When $WF_6$—$SiH_4$ gas mixture is charged into a reaction chamber for a predetermined time on the assumption that the oxide layer on the titanium nitride surface is of $TiO_2$ as mentioned previously, the reaction in $WF_6$—$SiH_4$—$TiO_2$ (s) system will be considered.

Figure 4:
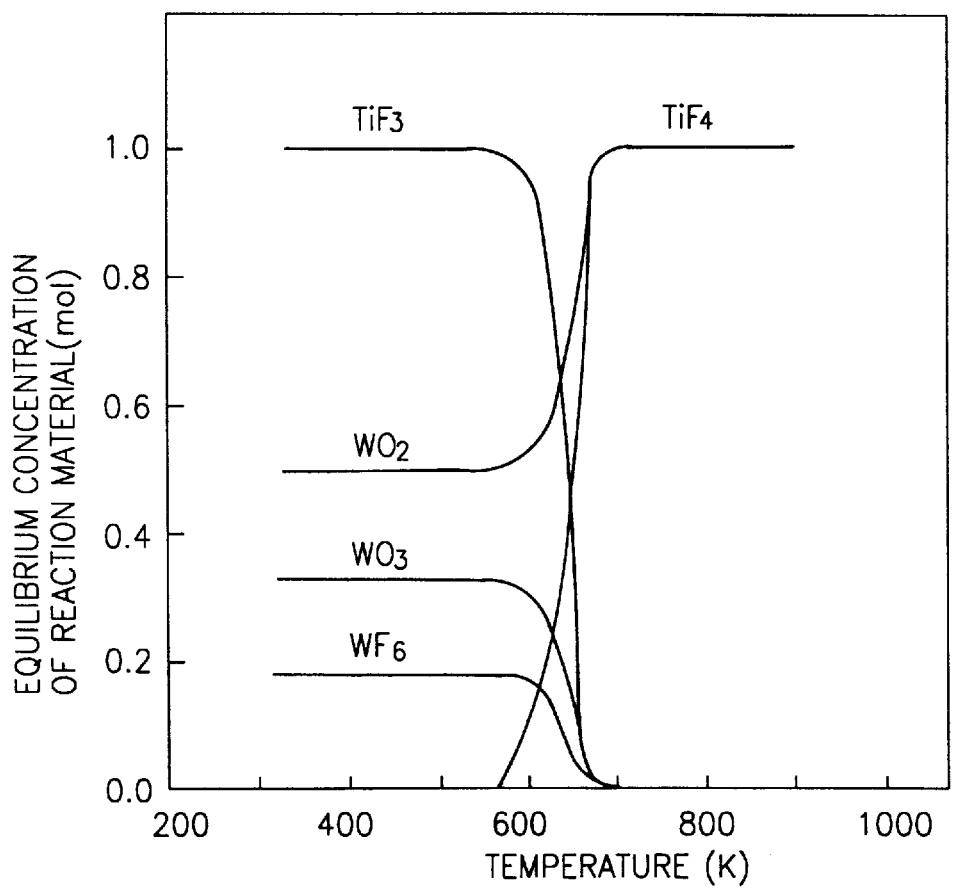
FIG. 4 shows thermodynamic simulation results in the present $WF_6$—$SiH_4$—$TiO_2$ system on the assumption that an oxide layer on a titanium nitride substrate is formed of $TiO_2$.

Referring to FIG. 4, there are plotted the concentrations of reaction products with regard to temperatures which are obtained by thermodynamically simulating the reaction in $WF_6$—$SiH_4$—$TiO_2$ (s) system. In this reaction, the concentrations of $WF_6$ and $SiH_4$ are 1 and 0.5 mole, respectively and pressure is maintained at 1 torr.

Figure 3:
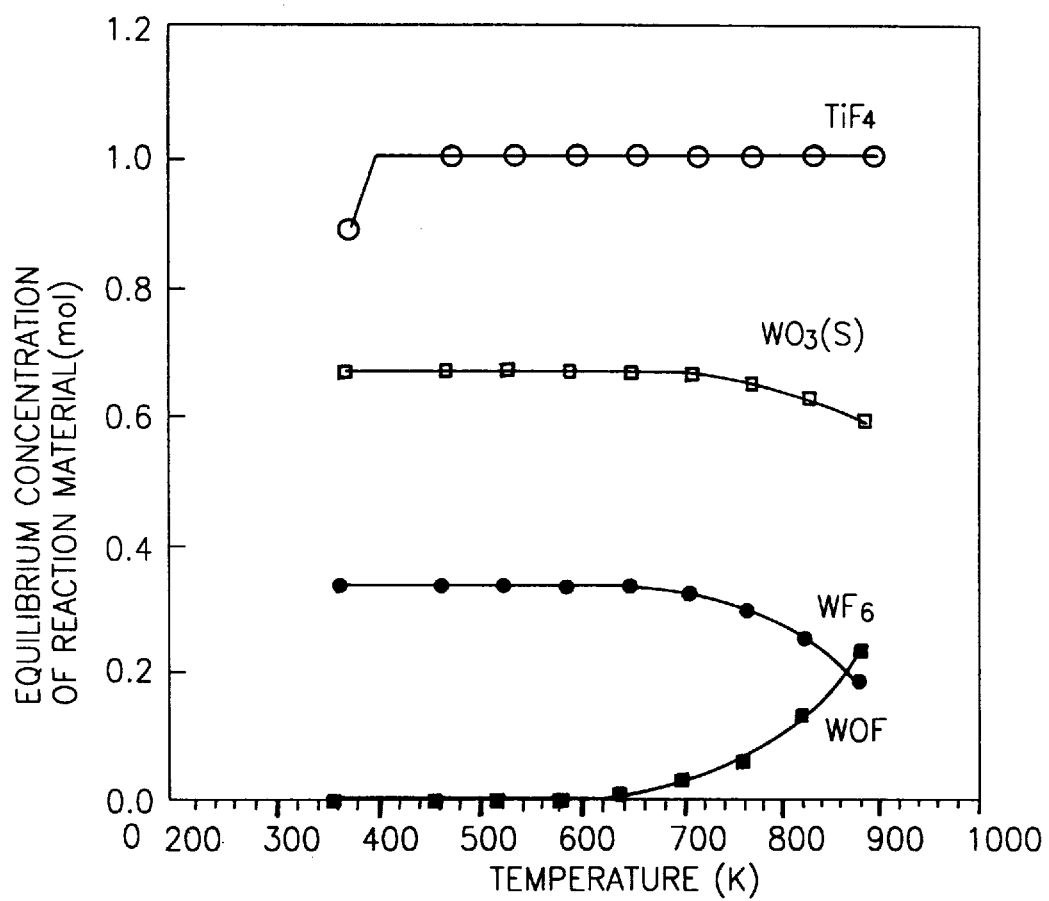
FIG. 3 shows thermodynamic simulation results in conventional $WF_6$—$TiO_2$ system on the assumption that an oxide layer on a titanium nitride substrate is formed of $TiO_2$.

As shown in FIG. 4, it is apparent that tungsten is not formed independently of temperature, which is true of the reaction in $WF_6$—$TiO_2$ (s) system of FIG. 3.

Meanwhile, the oxygen originating from $TiO_2$ (s) is partially transferred to a form of $WO_3$ (g) at 300° C. (573K) or lower but is removed in a form of $WO_2$ (g) at the entire temperature range.

In contrast with the reaction of FIG. 3, the reaction of FIG. 4 leads to the formation of two types of titanium fluoride, which is very sensitive to temperature. Nonvolatile $TiF_3$ (s) is formed at low temperature range. When temperature reaches about 300° C. (573K), the amount of $TiF_3$ (s) drops while volatile $TiF_4$ (s) increases. At about 320° C. (593K) only $TiF_4$ (s) forms.

Thus, the thermal treatment that employs $WF_6$—$SiH_4$ gas mixture at a substrate temperature of not less than 300° C. (573K) allows all the fluoride impurities to be removed in a form of $TiF_4$ and can also eliminate the oxide surface layer in a form of $WO_2$, resulting in a surface with a clear surface.

Figure 5:
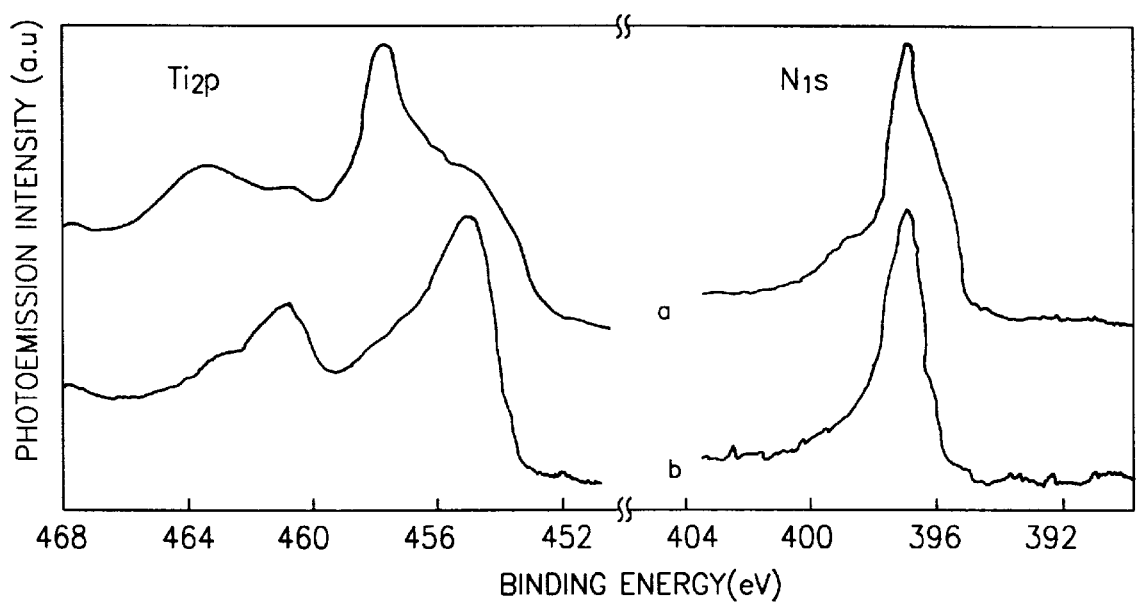
FIG. 5 is $Ti_{2p}$ and $N_{1s}$ XPS spectra of titanium nitride surface in which a is $Ti_{2p}$ and $N_{1s}$ spectrum obtained by analyzing the titanium nitride thin film grown by reactive sputtering, b is $Ti_{2p}$ and $N_{1s}$ spectrum obtained by XPS analysis for the titanium nitride substrate which is surface-pretreated with $WF_6$—$SiH_4/H_2$ gas mixture at 400° C. for 20 seconds under 1 torr or lower.

FIG. 5 shows an example that the oxide surface layer of the titanium nitride substrate is removed at 400° C. by surface treatment using $WF_6$—$SiH_4$ gas mixture. In this figure, a is $Ti_{2p}$ and $N_{1s}$ spectrum, which is obtained by analyzing the titanium nitride thin film grown by reactive sputtering through X-ray photoelectron spectroscopy (XPS). $Ti_{2p2/3}$ peak shown at 458.3 eV on $Ti_{2p}$ spectrum is responsible for $TiO_2$ while the peak shown at 455.0 eV is for Ti of TiN.

On $N_{1s}$ spectrum, the peak at 395.7 eV is responsible for oxynitride while the peak at 397.3 eV is for N of stoichiometric TiN.

As apparent from the result, an oxide layer is formed on the surface of TiN.

In FIG. 5, b is $Ti_{2p}$ and $N_{1s}$ spectrum, which is obtained by XPS analysis for the titanium nitride substrate which is surface-treated with $WF_6$—$SiH_4/H_2$ gas mixture at 400° C. for 20 seconds under 1 torr or lower. After reaction with the gas mixture, the Ti peak corresponding to titanium oxide almost disappears, whereas the peak at 456.4 eV, responsible for Ti of TiN, increases. Also, $N_{1s}$ spectrum is differentially shown. That is, the peak strength at 395.7 eV, corresponding to oxynitride film, is significantly decreased.

Therefore, the surface treatment of titanium nitride substrate with $WF_6$—$SiH_4/H_2$ allows the oxide layer of the titanium nitride to be almost completely removed.

It is very important to choose appropriate times for the amount of $WF_6$ and $SiH_4$. For example, when the surface of titanium nitride is treated with $WF_6$—$SiH_4$, if the treatment time is too short, the oxide surface layer is not removed completely. On the other hand, if the surface of titanium nitride is treated for too long time, $WF_x$ penetrates along grain boundary of titanium nitride, affecting other layers below the titanium nitride. In addition, a tungsten layer, undesirable layer, may be formed.

Figure 1:
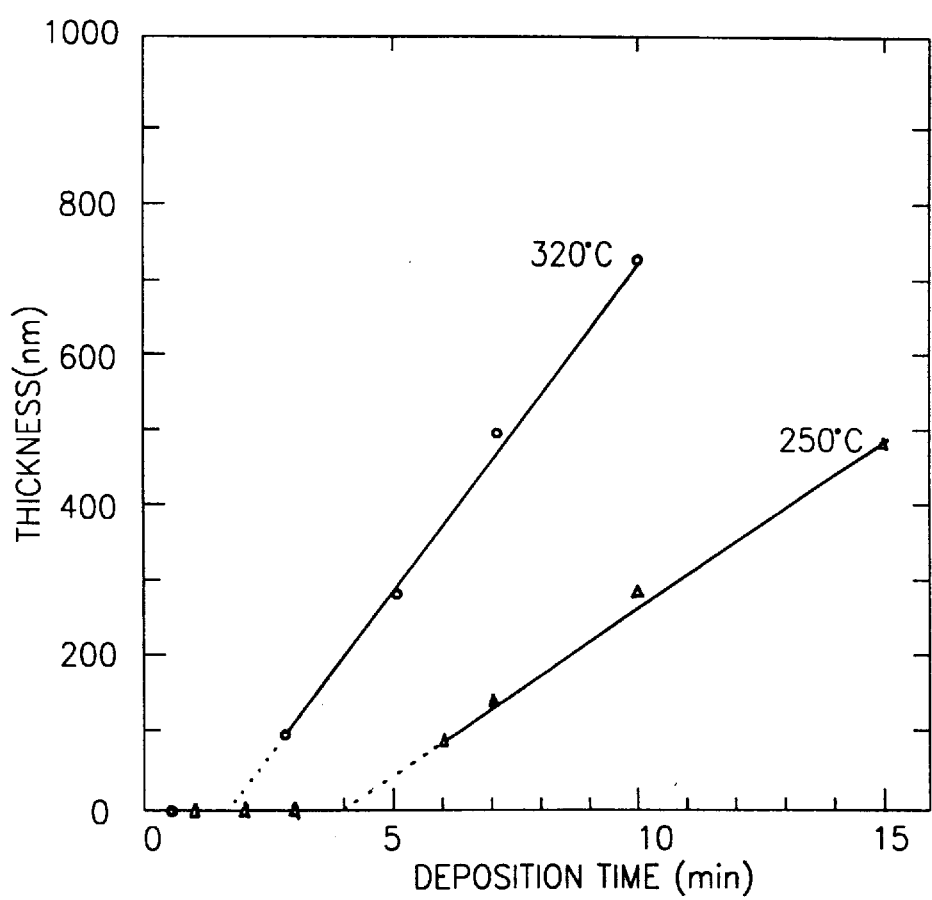
FIG. 1 is a plot of tungsten thin film thicknesses with regard to deposition times upon depositing a tungsten thin film on a titanium nitride at predetermined temperatures, showing apparent time delay to normal deposition.
Figure 2:
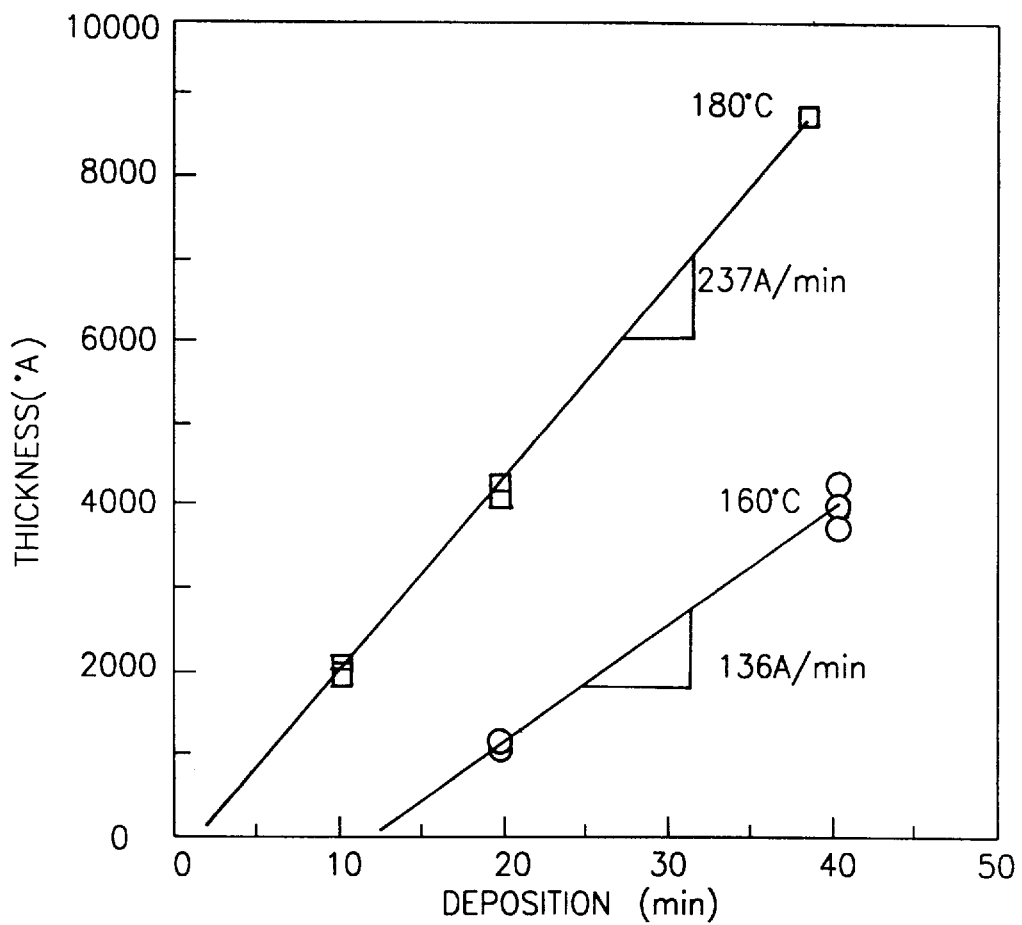
FIG. 2 is a plot of copper thin film thicknesses with regard to deposition times upon depositing a copper thin film on a titanium nitride at predetermined temperatures, showing apparent time delay to normal deposition.

Following is of the choice of appropriate treatment time, which will be illustrated through an example. When tungsten is deposited on a titanium nitride surface as shown in FIG. 1, extrapolation is first done at any temperatures by linear fitting from the plot of thin film thickness with regard to deposition time, to investigate apparent time delay, which is then plotted by deposition temperatures.

Figure 6:
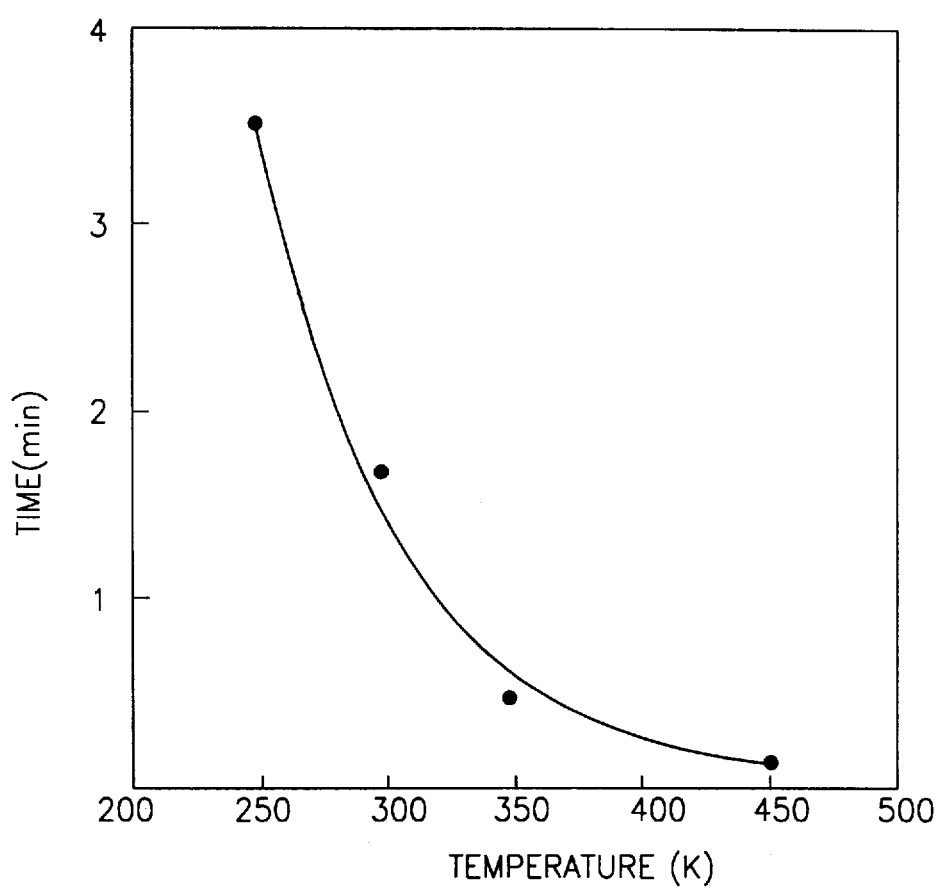
FIG. 6 is a plot showing exponentially decreased time delays with regard to increase of deposition temperatures upon using $WF_6$—$SiH_4/H_2$ gas mixture under 1 torr, which is obtained by extrapolation.

FIG. 6 is an example of such extrapolation in which time delays are plotted with regard to deposition temperatures upon $WF_6$—$SiH_4/H_2$ gas mixture under 1 torr. As shown in this plot, the time delay decreases exponentially as the deposition temperature increases.

In accordance with the present invention, about 60–80% of the time delay investigated is considered as the time suitable for surface treatment.

As described hereinbefore, the use of a reaction gas based on $WF_6$, such as $WF_6$—$SiH_4$, $WF_6$—$H_2$ or $WF_6$—$SiH_4$—$H_2$ can prevent oxide film such as $WO_3$ from being formed at the interface of semiconductor substrate. In addition, the oxide surface layer of titanium nitride can be controlled appropriately, which results in restriction of the penetration of $WF_x$ into grain boundary of titanium nitride. The oxide layer-free titanium nitride substrate which is accomplished by the control of surface treatment time in accordance with the present invention facilitates not only nucleation of subsequent thin film but also brings about uniform distribution of nucleation sites, thereby forming a thin film with uniform thickness and remarkably increasing the density of the thin film.

Other features, advantages and embodiments of the invention disclosed herein will be readily apparent to those exercising ordinary skill after reading the foregoing disclosures. In this regard, while specific embodiments of the invention have been described in considerable detail, variations and modifications of these embodiments can be effected without departing from the spirit and scope of the invention as described and claimed.

What is claimed is:

1. A method for pretreating a semiconductor substrate, comprising the steps of:

placing a titanium nitride substrate in a reaction chamber and subjecting the reaction chamber to vacuum;

purging the reaction chamber with an inert gas selected from the group consisting of $N_2$, Ar and He and evacuating the reaction chamber into 1 mTorr or lower;

treating the surface of the titanium nitride substrate with a reaction gas comprising WF compound having at least one of Si and H in an activation step;

charging a reducing gas and a source gas for deposition material after the activation treating step to form a thin film on the treated titanium nitride substrate.

2. A method in accordance with claim 1, wherein said reaction gas comprising WF is based on $WF_6$ compound and is any one selected from the group consisting of $WF_6$—$SiH_4$, $WF_6$—$H_2$ and $WF_6$—$SiH_4$—$H_2$.

3. A method in accordance with claim 1, wherein said reaction gas comprising WF is based on $WF_4Cl_2$ compound and is any one selected from the group consisting of $WF_4Cl_2$—$SiH_4$, $WF_4Cl_2$—$H_2$ and $WF_4Cl_2$—$SiH_4$—$H_2$.

4. A method in accordance with claim 2, wherein said reaction gas comprises $Si_2H_6$ or $Si_3H_8$ instead of $SiH_4$.

5. A method in accordance with claim 1, wherein said step of treating the surface is carried out at a pressure of about $10^{-3}$ to several tens Torr.

6. A method in accordance with claim 1, wherein said reaction gas has a $SiH_4:WF_6$ partial pressure ratio ranging from about 0.1–1.0.

7. A method in accordance with claim 1, wherein said step of treating the surface is carried out at a surface temperature ranging from about 300° to 600° C.

8. A method in accordance with claim 1, wherein said thin film on titanium nitride substrate is one selected from the group consisting of copper, aluminum, tungsten and various metal silicides.

9. A method in accordance with claim 8, wherein said metal silicide is $WSi_x$ or $TiSi_x$.

10. A method in accordance with claim 1, wherein the surface treatment and the thin film-forming steps are executed in a manner of in-situ process.

11. A method for pretreating a semiconductor substrate, comprising the steps of:

placing the semiconductor substrate in a reaction chamber and subjecting the reaction chamber to vacuum;

purging the reaction chamber with an inert gas and evacuating the reaction chamber;

treating the surface of the semiconductor substrate with a reaction gas comprising WF compound having at least one of Si and H that prevents an oxide layer from being formed at the surface of the semiconductor substrate; and charging a reducing gas and a source gas for deposition material to form a thin film on the treated substantially oxide free surface of the semiconductor substrate.

12. The method of claim 11, wherein a nucleation rate of said deposition material and a number of nucleation sites on the treated semiconductor substrate are increased.

13. The method according to claim 11, wherein the treatment step removes the oxide layer from the surface of the semiconductor substrate.

14. The method of claim 11, wherein the surface of the semiconductor substrate is substantially oxide free prior to the charging step, and wherein the semiconductor substrate is a titanium nitride substrate.

15. The method of claim 11, wherein said reaction gas is any one selected from the group consisting essentially of $WF_6$—$SiH_4$, $WF_6$—$H_2$, $WF_6$—$SiH_4$—$H_2$, $WF_4Cl_2$—$SiH_4$, $WF_4Cl_2$—$H_2$ and $WF_4Cl_2$—$SiH_4$—$H_2$.

16. The method of claim 15, wherein said reaction gas comprises $Si_2H_6$ or $Si_3H_8$ instead of $SiH_4$.

17. A method for pretreating a semiconductor substrate, comprising the steps of:

treating a surface of the semiconductor substrate with a reaction gas comprising a WF compound having at least one of a Si and H; and charging a reducing gas and a source gas for deposition material immediately following the treating step to form a thin film on the treated surface of the semiconductor substrate.

18. The method of claim 17, further comprising:

placing the semiconductor substrate in a reaction chamber and subjecting the reaction chamber to vacuum; and purging the reaction chamber with an inert gas and evacuating the reaction chamber.

19. The method of claim 18, wherein said reaction gas is selected from the group of $WF_6$—$SiH_4$, $WF_6$—$H_2$, $WF_6$—$SiH_4$—$H_2$, $WF_4Cl_2$—$SiH_4$, $WF_4Cl_2$—$H_2$ and $WF_4Cl_2$—$SiH_4$—$H_2$, and wherein the semiconductor substrate is a titanium nitride substrate.

20. The method of claim 18, wherein said reaction gas comprises $Si_2H_6$ or $Si_3H_8$ instead of $SiH_4$.

21. A method in accordance with claim 3, wherein said reaction gas comprises $Si_2H_6$ or $Si_3H_8$ instead of $SiH_4$.

* * * * *